(12) United States Patent
Miyamoto et al.

(10) Patent No.: US 11,782,542 B2
(45) Date of Patent: Oct. 10, 2023

(54) DISPLAY DEVICE

(71) Applicant: Japan Display Inc., Tokyo (JP)

(72) Inventors: Mitsuhide Miyamoto, Minato-ku (JP); Hajime Akimoto, Minato-ku (JP)

(73) Assignee: Japan Display Inc., Tokyo (JP)

( * ) Notice: Subject to any disclaimer, the term of this patent is extended or adjusted under 35 U.S.C. 154(b) by 213 days.

(21) Appl. No.: 17/068,938

(22) Filed: Oct. 13, 2020

(65) Prior Publication Data
US 2021/0026483 A1 Jan. 28, 2021

Related U.S. Application Data

(63) Continuation of application No. 15/929,009, filed on Apr. 24, 2018, now Pat. No. 10,866,664.

(30) Foreign Application Priority Data

May 12, 2017 (JP) .................. 2017-095243

(51) Int. Cl.
| | | |
|---|---|---|
| *G06F 3/041* | (2006.01) | |
| *G09G 3/3225* | (2016.01) | |
| *G06F 3/044* | (2006.01) | |
| *H10K 59/40* | (2023.01) | |

(52) U.S. Cl.
CPC .......... *G06F 3/0412* (2013.01); *G06F 3/0443* (2019.05); *G06F 3/0446* (2019.05); *G09G 3/3225* (2013.01); *G06F 2203/04111* (2013.01); *G06F 2203/04112* (2013.01); *G09G 2354/00* (2013.01); *H10K 59/40* (2023.02)

(58) Field of Classification Search
CPC ............ G06F 2203/04111; G06F 2203/04112; G06F 3/044–0448; G06F 2203/041111
See application file for complete search history.

(56) References Cited

U.S. PATENT DOCUMENTS

| | | | | |
|---|---|---|---|---|
| 8,052,498 B2* | 11/2011 | Chien | .................. | G06F 3/0443 |
| | | | | 430/318 |
| 8,493,349 B2* | 7/2013 | Hwang | ................. | G06F 3/0443 |
| | | | | 345/173 |
| 8,743,078 B2* | 6/2014 | Kim | ..................... | H10K 50/865 |
| | | | | 445/24 |

(Continued)

FOREIGN PATENT DOCUMENTS

JP 2016-081529 5/2016

*Primary Examiner* — Patrick F Marinelli
(74) *Attorney, Agent, or Firm* — Maier & Maier, PLLC

(57) ABSTRACT

The first and second touch electrodes constitute a mesh shape of staying away from overlap with the light-emitting pixels. Each electrode body has a first slim portion between adjacent light-emitting pixels in the first direction. Each electrode body has a first wide portion between adjacent light-emitting pixels in the second direction. The first wide portion is wider than the first slim portion. The jumper electrode has a second slim portion between adjacent light-emitting pixels in the first direction. The jumper electrode has a second wide portion between adjacent light-emitting pixels in the second direction. The second wide portion is wider than the second slim portion. The light-emitting pixels each have a planar shape longer in the second direction than in the first direction. The first and second wide portions are overlapped and electrically conductive, penetrating the insulation film.

14 Claims, 7 Drawing Sheets

(56) References Cited

U.S. PATENT DOCUMENTS

| | | | | |
|---|---|---|---|---|
| 8,963,856 | B2* | 2/2015 | Liu | G06F 3/0446 345/173 |
| 9,229,560 | B2* | 1/2016 | Kang | G06F 3/0412 |
| 9,459,750 | B2* | 10/2016 | Han | G06F 3/0446 |
| 9,519,174 | B2* | 12/2016 | Kim | G06F 3/0446 |
| 9,671,886 | B2* | 6/2017 | Yoo | G06F 3/0412 |
| 9,772,709 | B2* | 9/2017 | Kim | G06F 3/0443 |
| 9,817,529 | B2* | 11/2017 | Bae | G06F 3/0443 |
| 10,095,362 | B2* | 10/2018 | Hirakata | G06F 3/0446 |
| 10,353,498 | B2* | 7/2019 | Feng | G06F 3/0446 |
| 10,353,501 | B2* | 7/2019 | Akimoto | G06F 3/04164 |
| 10,684,500 | B2* | 6/2020 | Shishido | G06F 3/0446 |
| 10,866,664 | B2* | 12/2020 | Miyamoto | G09G 3/3225 |
| 10,963,082 | B2* | 3/2021 | Lin | G06F 3/0446 |
| 11,023,058 | B2* | 6/2021 | Park | G06F 3/04164 |
| 11,144,168 | B1* | 10/2021 | Lin | G06F 3/0448 |
| 2010/0013745 | A1* | 1/2010 | Kim | G06F 3/0412 345/76 |
| 2010/0214247 | A1* | 8/2010 | Tang | G06F 3/04164 200/600 |
| 2011/0032209 | A1* | 2/2011 | Kim | G06F 3/0446 445/24 |
| 2011/0141037 | A1* | 6/2011 | Hwang | G06F 3/0446 345/173 |
| 2012/0319964 | A1* | 12/2012 | Liu | G06F 3/0446 345/173 |
| 2013/0341651 | A1* | 12/2013 | Kim | H01L 27/027 257/432 |
| 2014/0111709 | A1* | 4/2014 | Kim | G02F 1/13338 349/12 |
| 2014/0253495 | A1* | 9/2014 | Kang | G06F 3/0443 345/174 |
| 2015/0049260 | A1* | 2/2015 | Yashiro | G06F 3/0446 349/12 |
| 2015/0220191 | A1* | 8/2015 | Huh | G06F 3/0443 345/173 |
| 2015/0234425 | A1* | 8/2015 | Kim | H01L 31/18 345/174 |
| 2015/0261370 | A1* | 9/2015 | Yoo | G06F 3/0412 345/173 |
| 2015/0346866 | A1* | 12/2015 | Kusunoki | G06F 3/04166 345/174 |
| 2016/0070406 | A1* | 3/2016 | Han | G06F 3/0446 345/173 |
| 2016/0081183 | A1* | 3/2016 | Ha | G09G 5/003 345/174 |
| 2016/0103516 | A1* | 4/2016 | An | H10K 59/35 345/174 |
| 2016/0109998 | A1* | 4/2016 | Watanabe | G06F 3/0412 345/173 |
| 2016/0202827 | A1* | 7/2016 | Bae | G06F 3/0443 345/174 |
| 2016/0282989 | A1* | 9/2016 | Hirakata | G06F 3/0446 |
| 2016/0349558 | A1* | 12/2016 | Shishido | G02F 1/13338 |
| 2017/0108964 | A1* | 4/2017 | Sato | G06F 3/0446 |
| 2017/0147116 | A1* | 5/2017 | Lee | G06F 3/0446 |
| 2017/0147126 | A1* | 5/2017 | Chiu | G06F 3/0446 |
| 2018/0039360 | A1* | 2/2018 | Akimoto | H10K 50/86 |
| 2018/0120998 | A1* | 5/2018 | Jeong | G06F 3/0446 |
| 2018/0143720 | A1* | 5/2018 | Kim | G06F 3/0412 |
| 2018/0190723 | A1* | 7/2018 | Han | G06F 3/0412 |
| 2018/0329549 | A1* | 11/2018 | Miyamoto | G06F 3/0446 |
| 2019/0050078 | A1* | 2/2019 | Hamada | H05K 1/0213 |
| 2019/0064980 | A1* | 2/2019 | Oh | G06F 3/0412 |
| 2019/0294284 | A1* | 9/2019 | Akimoto | G06F 3/0443 |
| 2019/0361546 | A1* | 11/2019 | Pang | G06F 3/0412 |
| 2020/0091247 | A1* | 3/2020 | Lee | H10K 59/12 |
| 2020/0285349 | A1* | 9/2020 | Lin | G06F 3/0412 |
| 2021/0026483 | A1* | 1/2021 | Miyamoto | G06F 3/0443 |
| 2023/0078715 | A1* | 3/2023 | Sirkia | G09G 3/2085 |

* cited by examiner

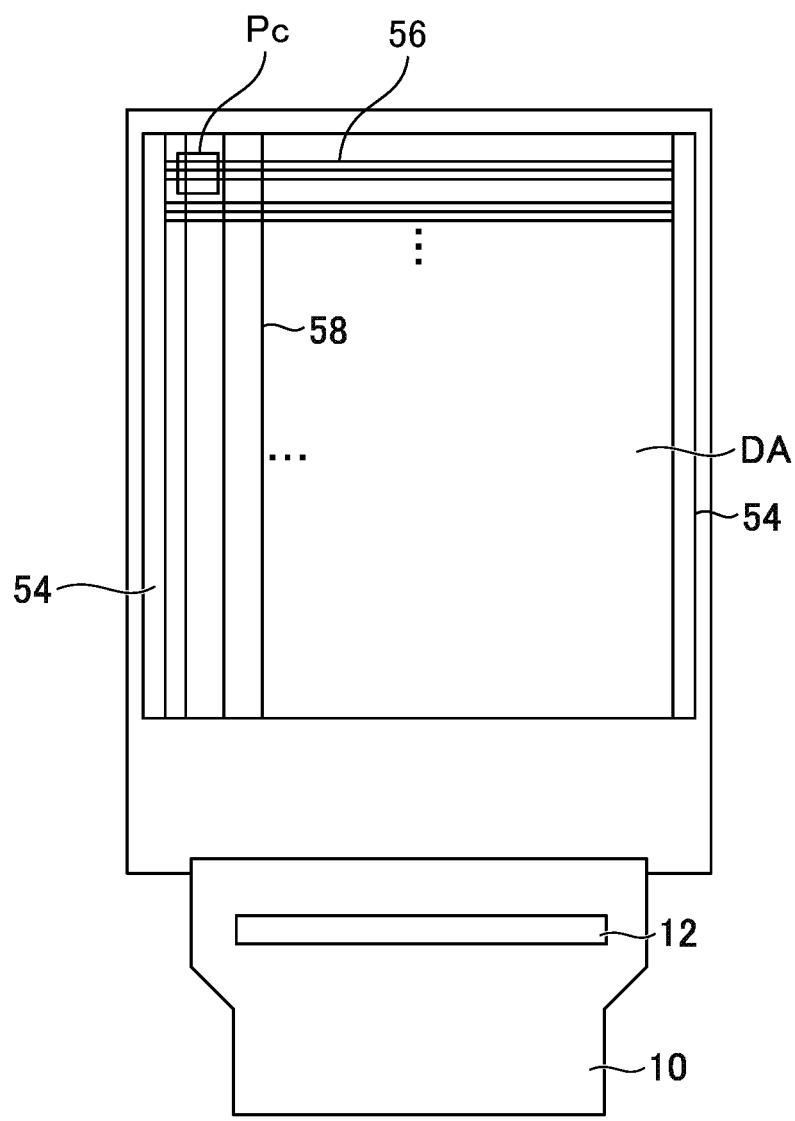

FIG.6
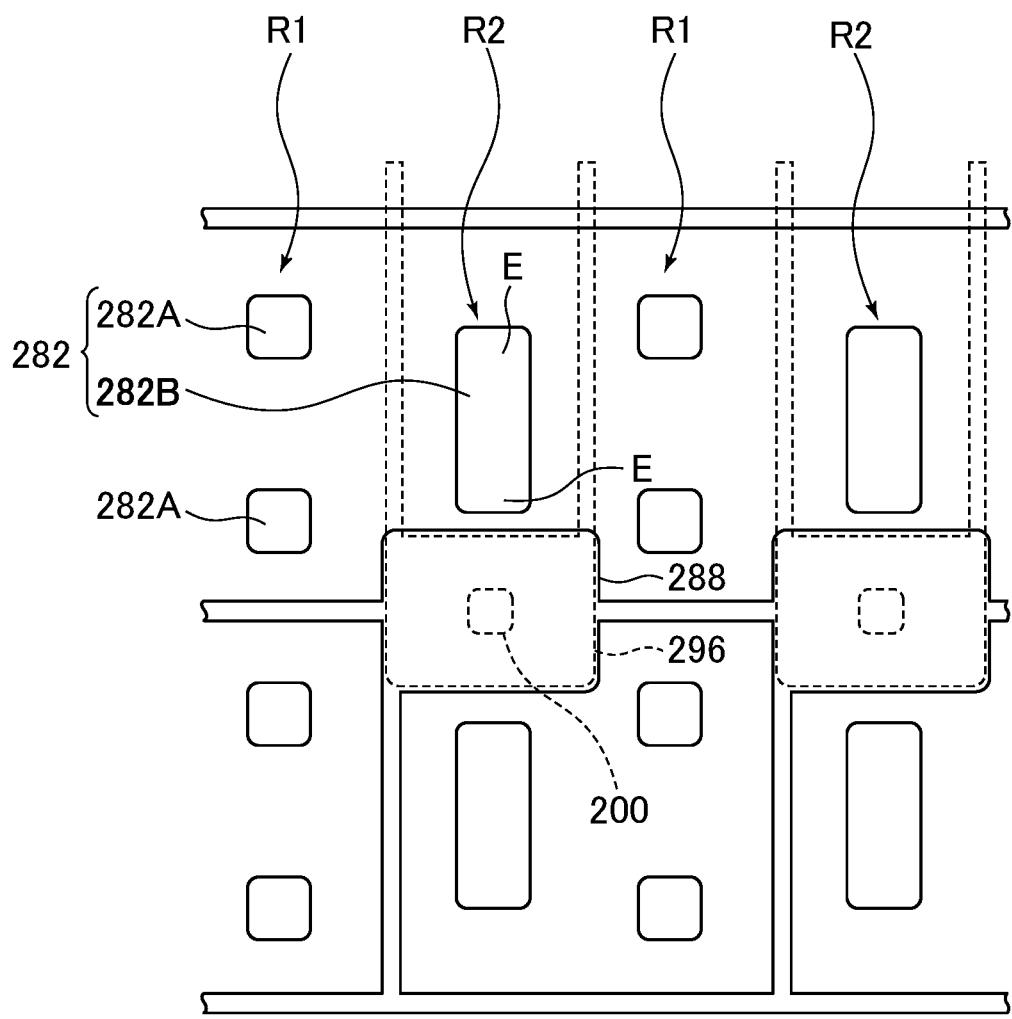
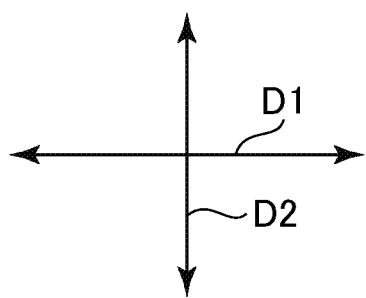

DISPLAY DEVICE

CROSS-REFERENCE TO RELATED APPLICATION

The present application is a continuation Applications of U.S. application Ser. No. 15/929,009, filed Apr. 24, 2018, which claims priority to Japanese application JP2017-095243 filed on May 12, 2017. The entire contents of the above-identified applications are incorporated herein by reference.

BACKGROUND OF THE INVENTION

1. Field of the Invention

This relates to display devices.

2. Description of the Related Art

Portable terminals such as smartphones have been commonly equipped with a touch censor. A touch panel, assembled in other processes, used to be attached to a display panel, whereas on-cell touch panels allow for slimming-down and module cost-cutting. Processes for achieving an on-cell process of the touch panel to the display panel may include forming touch electrodes on a sealing film for sealing an organic electroluminescence element.

The touch electrodes are designed for detecting finger touch and have a relatively large width although one pixel has an extremely small width. This makes it likely to use porous touch electrodes in a mesh form to pass light (JP 2016-081529A).

Touch sensing in a mutual capacitance type is achieved with longitudinal electrodes in a longitudinal direction and lateral electrodes in a lateral direction. Forming the longitudinal electrodes and the lateral electrodes in the same layer requires a jumper line with an interlayer dielectric interposed therebetween.

The longitudinal electrodes or the lateral electrodes and the jumper line are electrically connected through a through-hole in the interlayer dielectric. Particularly, the touch electrodes in a mesh shape, which have a narrow conductive portion, need to have a wide connection portion with the jumper line. The wide connection portion blocks light in an oblique direction, raising a problem of degrading viewing angle characteristics.

SUMMARY OF THE INVENTION

This aims to suppress degradation of viewing angle characteristics.

A display device may include a circuit layer including a plurality of light-emitting pixels arranged in rows, the rows being adjacent to one another in a first direction, the plurality of light-emitting pixels in each of the rows arranged in a second direction perpendicular to the first direction; first touch electrodes on the circuit layer and extending in the first direction; second touch electrodes on the circuit layer and extending in the second direction; an insulation film interposed between the first touch electrodes and the second touch electrodes for insulation and grade separation; wherein each of the second touch electrodes includes electrode bodies in a first layer where the first touch electrodes lie, each of the second touch electrodes including a jumper electrode in a second layer different from the first layer, the jumper electrode overlapping with a corresponding at least one of the first touch electrodes with the insulation film interposed therebetween, the jumper electrode connecting an adjacent pair of the electrode bodies in the second direction, the first touch electrodes and the second touch electrodes constitute a mesh shape of staying away from overlap with the plurality of light-emitting pixels, each of the electrode bodies has a first slim portion between an adjacent pair of the light-emitting pixels in the first direction, each of the electrode bodies having a first wide portion between an adjacent pair of the light-emitting pixels in the second direction, the first wide portion being wider than the first slim portion, the jumper electrode has a second slim portion between an adjacent pair of the light-emitting pixels in the first direction, the jumper electrode having a second wide portion between an adjacent pair of the light-emitting pixels in the second direction, the second wide portion being wider than the second slim portion, the plurality of light-emitting pixels each have a planar shape longer in the second direction than in the first direction, and the first wide portion and the second wide portion are overlapped and electrically conductive, penetrating the insulation film.

The first wide portion and the second wide portion are overlapped and electrically conductive, next to the light-emitting pixel in the second direction, specifically on a side where the light-emitting pixel has its narrower side. The first wide portion and the second wide portion block light in a small width, suppressing degradation of viewing angle characteristics.

BRIEF DESCRIPTION OF THE DRAWINGS

FIG. 3 is a diagram of a circuit for displaying images of the display device in FIG. 1.

FIG. 6 is an enlarged partial view of a display area of a display device in accordance with a second embodiment.

DETAILED DESCRIPTION OF THE INVENTION

Figure 1:
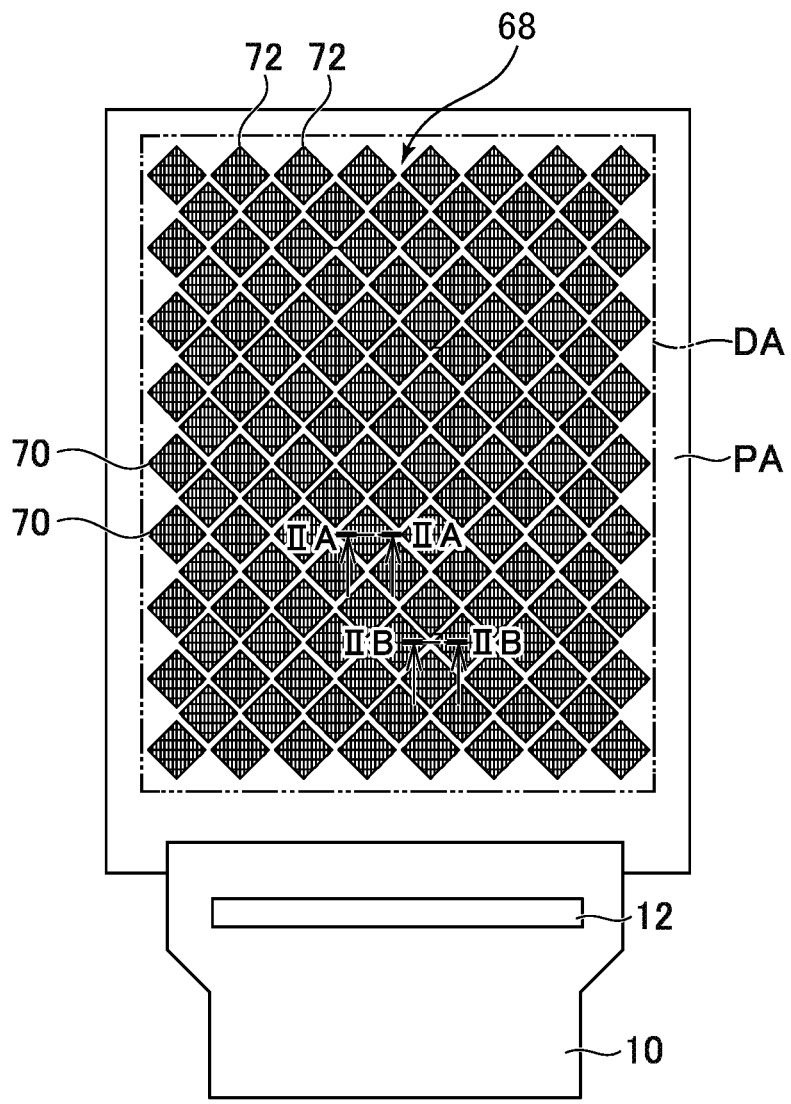
FIG. 1 is a plan view of a display device in accordance with a first embodiment.

Hereinafter, embodiments will be described with reference to the drawings. Here, the invention can be embodied according to various aspects within the scope of the invention without departing from the gist of the invention and is not construed as being limited to content described in the embodiments exemplified below.

The drawings are further schematically illustrated in widths, thickness, shapes, and the like of units than actual forms to further clarify description in some cases, but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

First Embodiment

FIG. 1 is a plan view of a display device in accordance with a first embodiment. The display device is an organic electroluminescence display device. The display device is configured to display a full-color image in full-color pixels, each of which consists of combination of unit pixels (sub-pixels) of colors such as red, green, and blue. The display device includes a display area DA and a peripheral area PA around the display area DA. The peripheral area PA is outside the display area DA. A flexible printed circuit board 10 is connected to the peripheral area PA. On the flexible printed circuit board 10 is mounted an integrated circuit chip 12, which includes a driver for data signal driving. Another flexible printed circuit board for touch sensing may be additionally connected.

Figure 2A:
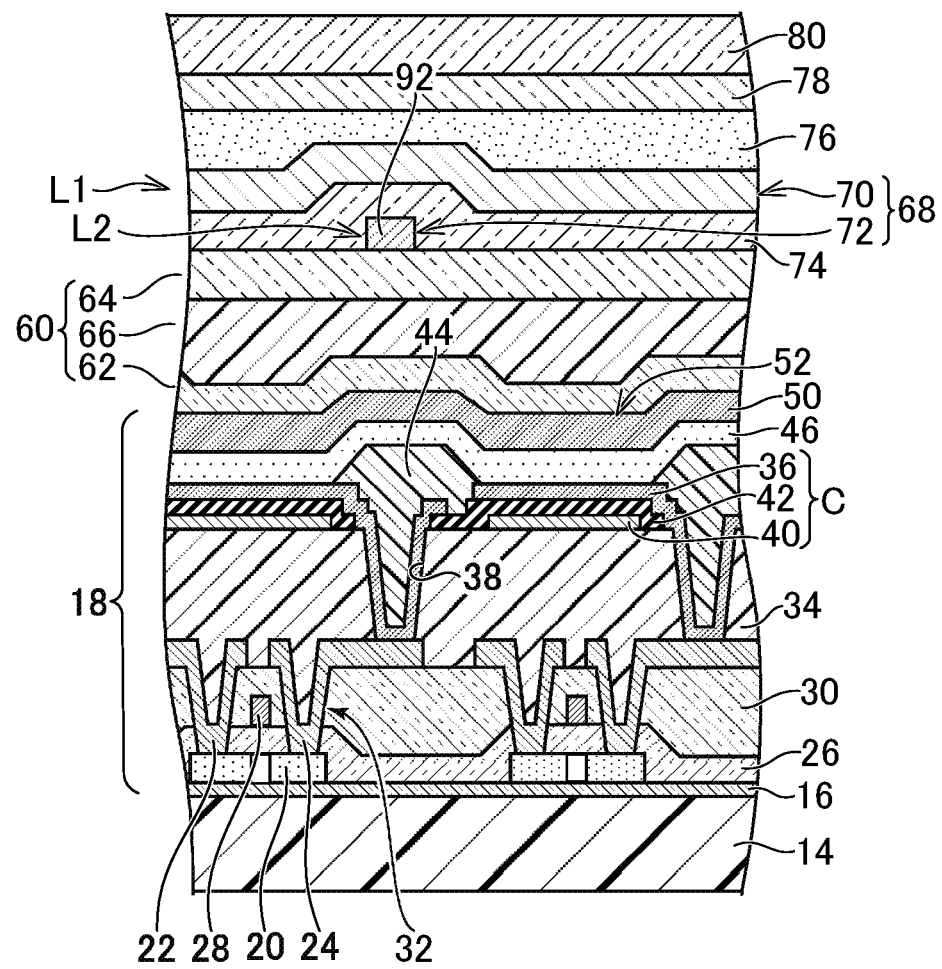
FIG. 2A is an enlarged view of a portion of IIA-IIA line cross section of the display device in FIG. 1.
Figure 2B:
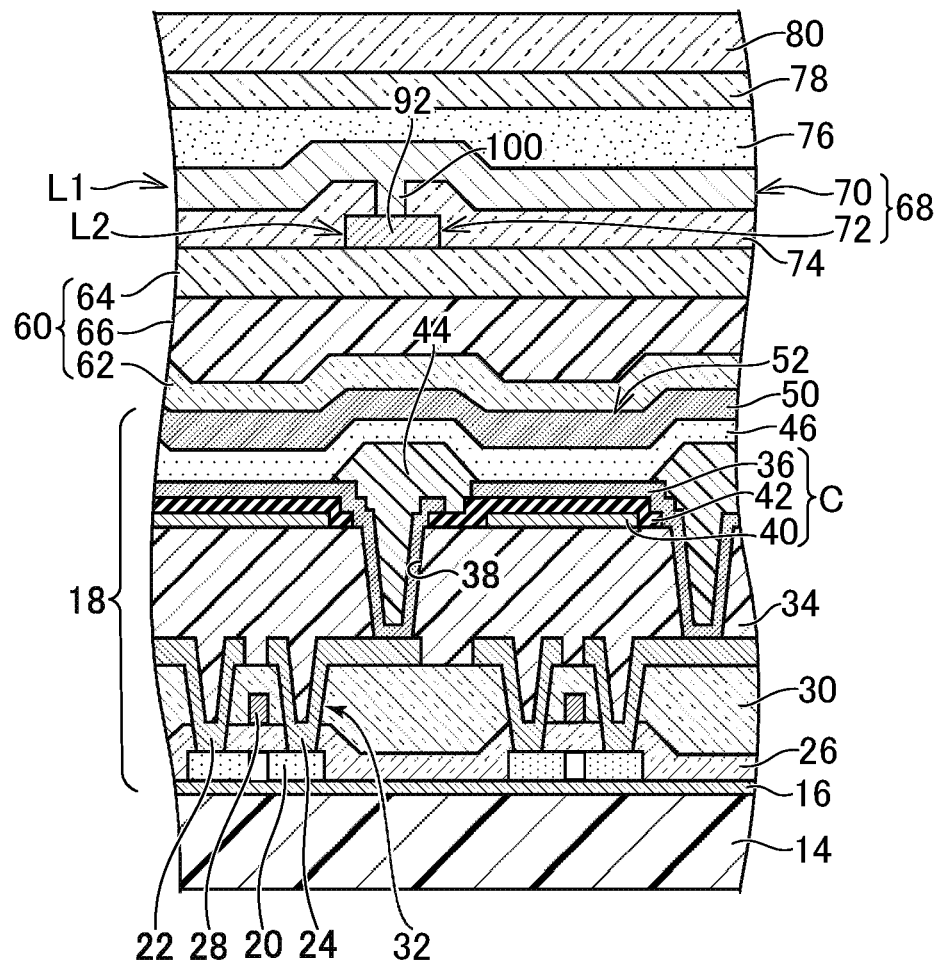
FIG. 2B is an enlarged view of a portion of IIB-IIB line cross section of the display device in FIG. 1.

FIG. 2A and FIG. 2B are enlarged views of portions of IIA-IIA and IIB-IIB line cross sections, respectively, of the display device in FIG. 1. The substrate 14 may be formed from polyimide resin or polyethylene terephthalate, having flexibility. The substrate 14 has an underlying insulation film 16 formed thereon for a barrier against impurities contained therein. The underlying insulation film 16 may be a silicone oxide film or a silicon nitride film or may be a laminate structure thereof.

On the underlying insulating film 16 is a circuit layer 18. The circuit layer 18 includes a circuit for displaying images in the display area DA. Particularly, the circuit layer 18 includes a semiconductor layer 20 on the underlying insulating film 16. The semiconductor layer 20 is electrically connected to a source electrode 22 and a drain electrode 24 and is covered with a gate insulation film 26. On the gate insulation film 26 is a gate electrode 28, which is covered with an interlayer dielectric 30. The source electrode 22 and a drain electrode 24 penetrate the gate insulation film 26. The source electrode 22 and the drain electrode 24 are just on the interlayer dielectric 30 in the display area DA and penetrate the interlayer dielectric 30.

The semiconductor layer 20, the source electrode 22, the drain electrode 24, the gate electrode 28, and the gate insulation film 26 constitute at least part of a thin film transistor 32. The thin film transistor 32 is provided in the display area DA as shown in FIG. 1. In the display area DA the gate electrode 28 is just on the gate insulation film 26. The thin film transistor 32 is covered with a planarization film 34. The planarization film 34 is formed from an organic material such as a polyimide resin or a photosensitive acrylic resin.

On the planarization film 34 are a plurality of pixel electrodes 36 (e.g. anodes) for respective unit pixels (sub-pixels). The pixel electrode 36 has a laminate structure of an electrode film and a light reflective film. The pixel electrode 36 is electrically connected to one of the source electrode 22 and the drain electrode 24 above the interlayer dielectric 30, through a contact hole 38 penetrating the planarization film 34.

The pixel electrode 36 is also one electrode of a capacitor C. The capacitor C includes the pixel electrode 36, a capacitance electrode 40 thereunder, and a dielectrics insulation film 42 between the pixel electrode 36 and the capacitance electrode 40. The capacitor C holds a signal for controlling a current to be supplied to the pixel electrode 36.

On the pixel electrode 36 is an insulation layer 44, which may be made from a polyimide resin or an acrylic resin. The insulation layer 44 is on a periphery of the pixel electrode 36 and has an opening to expose a portion of the pixel electrode 36 (e.g. its central portion). The insulation layer 44 constitutes a bank surrounding a portion of the pixel electrode 36.

On the plurality of pixel electrodes 36 is an organic electroluminescence layer 46. The organic electroluminescence layer 46 incudes a hole injection layer, a hole transport layer, light emitting layers, an electron transport layer, and an electron injection layer. The light emitting layers are individually (separately) disposed for respective pixel electrodes 36 to emit light of blue, red, or green for respective pixels. The color for each pixel is not limited thereto and may be yellow or white. Among the layers which constitute the organic electroluminescence layer 46, some layers except for the light emitting layers extend over the plurality of pixels all over the display area DA in FIG. 1. The organic electroluminescence layer 46 is continuous on the insulation layer 44 as well.

On the organic electroluminescence layer 46 is a common electrode 50 (e.g. cathode). The common electrode 50 is on the insulation layer 44 for the bank. The pixel electrode 36 and the common electrode 50 with the organic electroluminescence layer 46 interposed therebetween constitute at least part of the light emitting element 52. The organic electroluminescence layer 46 is interposed between the pixel electrode 36 and the common electrode 50 to emit light by a current flowing between them, with its brightness controlled by the current. The plurality of light emitting elements 52 are arranged in the display area DA and driven by the plurality of thin film transistors 32. The capacitor C corresponds to each light emitting element 52.

The organic electroluminescence layer 46 is sealed with the sealing film 60 and is blocked from moisture. The plurality of light emitting elements 52 are sealed with the sealing film 60. The sealing film 60 has a structure where an organic film 66 made from a material such as a resin is interposed between a pair of inorganic layer 62, 64 made from material such as silicon nitride. The sealing film 60 covers the display area DA.

On the sealing film 60 is laminated a touch electrode 68 for touch sensing. The touch electrode 68 is a group of electrodes for touch sensing in a mutual capacitance type, including a first touch electrode 70 and a second touch electrode 72 electrically insulated from each other with an insulation film 74 therebetween. To cover them, a circularly polarizing plate 78 and a cover glass 80 are laminated with an adhesive layer 76 thereunder.

FIG. 3 is a diagram of a circuit for displaying images of the display device in FIG. 1. The display device has a control signal driving circuit 54. In the display area DA shown in the illustration are arranged a plurality of control signal lines 56 extending in a lateral direction and a plurality of data signal lines 58 extending in a longitudinal direction. In this example, three control signal lines 56 are arranged for the pixels in one row. Some unillustrated interconnect lines such as a power line for providing a constant voltage to light emitting elements 52 are arranged in the display area DA. Around an intersection point of the control signal line 56 and the data signal line 58, a pixel circuit Pc is disposed to control brightness of light in each pixel in accordance with a data signal.

Figure 4:
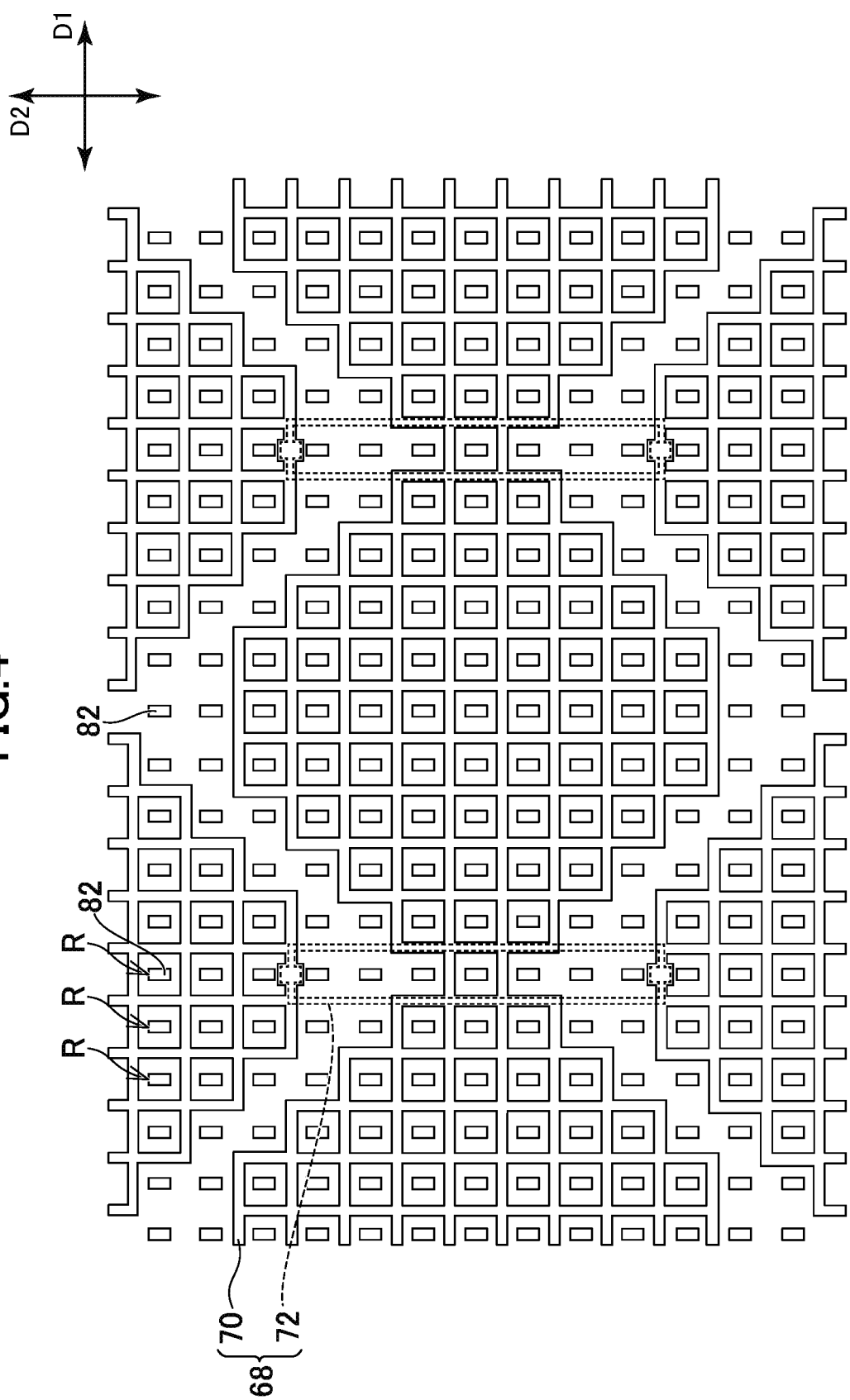
FIG. 4 is an enlarged plan view of a portion of the display device in FIG. 1.

FIG. 4 is an enlarged plan view of a portion of the display device in FIG. 1. The circuit layer 18 (FIG. 2) includes a plurality of light-emitting pixels 82. The light-emitting pixel 82 is an area where the light emitting element 52 (FIG. 2)

emits light. In the embodiment, as shown in FIG. 2, an area of the pixel electrode 36, which is exposed from the insulation layer 44, is the light-emitting pixel 82. The plurality of light-emitting pixels 82 are arranged in some rows R, which are adjacent to each other in the first direction D1. In each row R, the light-emitting pixels 82 are arranged in a second direction D2, perpendicular to the first direction D1. Each light-emitting pixel 82 has a longer shape in the second direction D2 than in the first direction D1. The plurality of light-emitting pixels 82 are arranged to be adjacent to each other in the first direction D1 and the second direction D2. The touch electrode 68 is made from metal to be highly conductive. Since the metal blocks light, the touch electrode 68 is in a mesh shape to avoid overlap with the light-emitting pixel 82.

Figure 5:
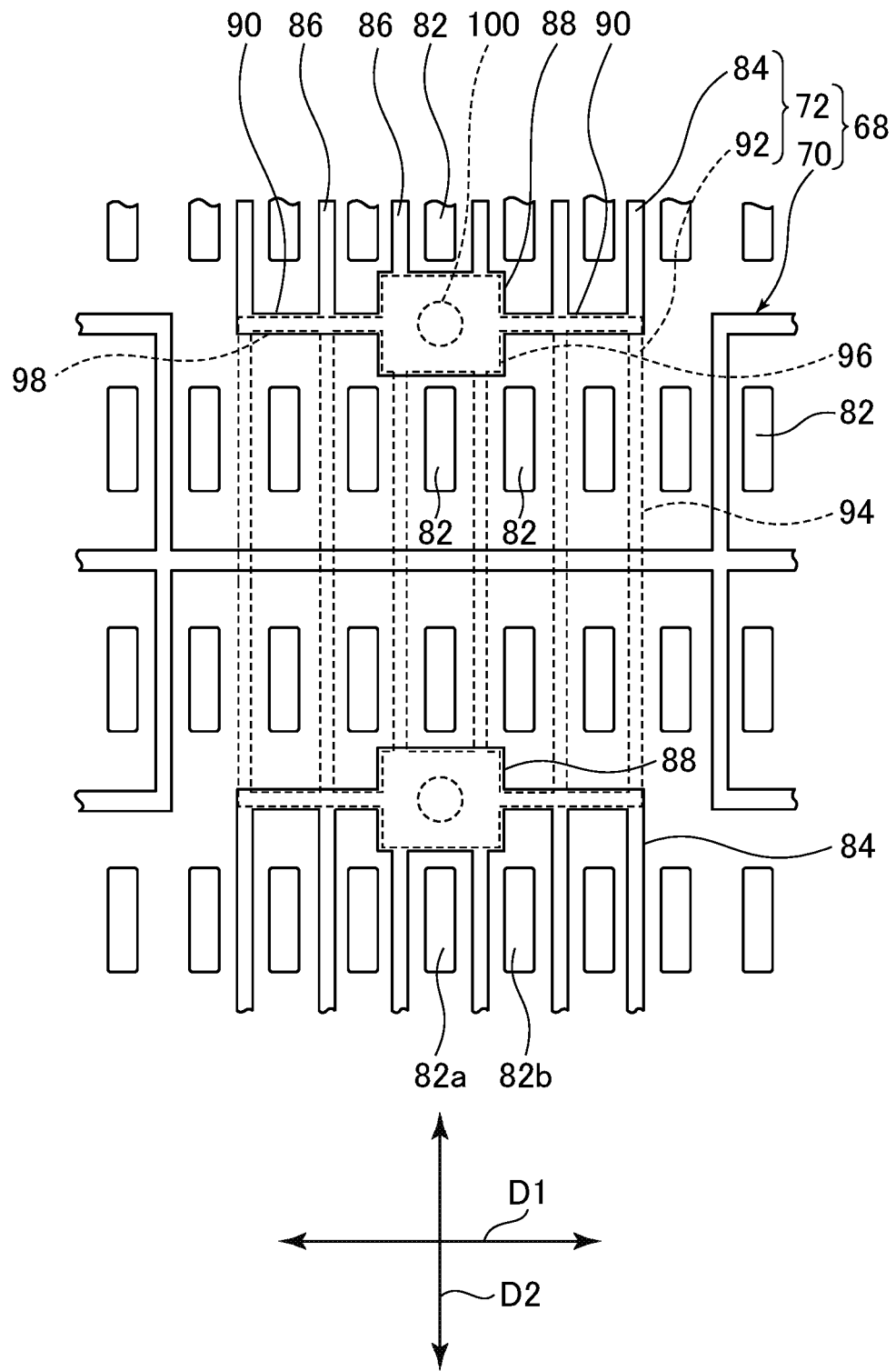
FIG. 5 is a detailed plan view of touch electrodes.

FIG. 5 is a detailed plan view of touch electrodes. The touch electrode 68 includes first touch electrodes 70 and second touch electrodes 72. The first touch electrodes 70 are laminated on the circuit layer 18 (FIG. 2A and FIG. 2B), extending in the first direction D1. The first touch electrodes 70 are in the first layer L1 (FIG. 2A and FIG. 2B). The second touch electrodes 72 are laminated on the circuit layer 18, extending in the second direction D2.

The second touch electrode 72 includes an electrode body 84. The electrode body 84 is in the first layer L1, just like the first touch electrode 70. The electrode body 84 includes a first slim portion 86 between adjacent light-emitting pixels 82 in the first direction D1. The electrode body 84 includes a first wide portion 88 between adjacent light-emitting pixels 82 in the second direction D2. The first wide portion 88 is adjacent to the light-emitting pixel 82a in the second direction D2 and is adjacent, in the second direction D2, to no portion of other light-emitting pixels 82b that are adjacent to the light-emitting pixel 82a in the first direction D1. The first wide portion 88 is wider in the first direction D1 than the light-emitting pixel 82a, which is adjacent in the second direction D2.

The first wide portion 88 is wider than the first slim portion 86. The electrode body 84 includes a first connecting portion 90, which extends from the first wide portion 88 in the first direction D1 and is connected to the first slim portion 86. The first connecting portion 90 is narrower in the second direction D2 than the first wide portion 88.

The second touch electrode 72 includes a jumper electrode 92 in a second layer L2 different from the first layer L1 (FIG. 2A and FIG. 2B). The jumper electrode 92 includes a second slim portion 94 between adjacent light-emitting pixels 82 in the first direction D1. The jumper electrode 92 includes a second wide portion 96 between adjacent light-emitting pixels 82 in the second direction D2. The second wide portion 96 is adjacent to the light-emitting pixel 82a in the second direction D2 and is adjacent, in the second direction D2, to no portion of other light-emitting pixels 82b that are adjacent to the light-emitting pixel 82a in the first direction D1. The second wide portion 96 is wider in the first direction D1 than the light-emitting pixel 82a that is adjacent in the second direction D2. The second wide portion 96 is wider than the second slim portion 94. The jumper electrode 92 includes a second connecting portion 98, which extends from the second wide portion 96 in the first direction D1 and is connected to the second slim portion 94. The second connecting portion 98 is narrower in the second direction D2 than the second wide portion 96.

The jumper electrode 92 in FIG. 2A overlaps with the first touch electrode 70 with the insulation film 74 interposed therebetween. The first touch electrode 70 and the second touch electrode 72 have the insulation film 74 interposed therebetween for insulation and grade separation. The first connecting portion 90 and the second connecting portion 98 are overlapped and insulated with the insulation film 74 interposed therebetween. The first wide portion 88 and the second wide portion 96 are overlapped and electrically connected at a contact portion 100, penetrating the insulation film 74, as shown in FIG. 2B. This enables the jumper electrode 92 to connect adjacent electrode bodies 84 in the second direction D2.

According to the embodiment, the first wide portion 88 and the second wide portion 96 are overlapped and electrically conductive, next to the light-emitting pixel 82 in the second direction D2, specifically on a side where the light-emitting pixel 82 has its narrower side. The first wide portion 88 and the second wide portion 96 block light in a small width, suppressing degradation of viewing angle characteristics.

Second Embodiment

FIG. 6 is an enlarged partial view of a display area DA of a display device in accordance with a second embodiment. In this embodiment, a plurality of light-emitting pixels 282 are arranged in rows, which include first rows R1 and second rows R2. The first rows R1 and the second rows R2 are alternately arranged in the first direction D1. In each first row R1, first light-emitting pixels 282A are arranged. In each second row R2, second light-emitting pixels 282B are arranged.

The second light-emitting pixel 282B is configured to emit light in blue. The second light-emitting pixel 282B has a longer shape in the second direction D2 than the first light-emitting pixel 282A. A blue light emitting layer has lower luminous efficiency and a short lifetime. The second light-emitting pixel 282B for blue is made large to increase a current without increasing a current density. Accordingly, the first light-emitting pixel 282A for emitting light in red or green and the second light-emitting pixel 282B for emitting light in blue are equivalent in luminescence of the light emitting layer and in the lifetime, eliminating effect on color dependency of the luminous efficiency and the element lifetime. Additionally, the pixel in blue is lower in luminous sensitivity than in red or green, leading to low visibility of brightness change by light shielding.

The second light-emitting pixel 282B has both ends E in the second direction D2. Each end E is adjacent to the first light-emitting pixel 282A in the first direction D1. The second light-emitting pixel 282B (its central portion in the second direction D2) is next, in the first direction D1, to an area between an adjacent pair of first light-emitting pixels 282A in the second direction D2.

In this embodiment as well, the first wide portion 288 and the second wide portion 296 are overlapped and electrically conductive at the contact portion 200, next to the light-emitting pixel 282 in the second direction D2, specifically on a side where the light-emitting pixel 282 has its narrower side. The first wide portion 288 and the second wide portion 296 block light in a small width, suppressing degradation of viewing angle characteristics. What is explained in the first embodiment is true of this embodiment in detail.

The display device is not limited to the organic electroluminescence display device but may be a display device with a light-emitting element disposed in each pixel, such as a quantum-dot light-emitting diode (QLED).

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
a circuit layer including a plurality of light-emitting pixels;
first touch electrodes provided in a first layer on the circuit layer and extending in a first direction; and
second touch electrodes on the circuit layer and extending in a second direction crossing the first direction, each of the second touch electrodes including electrode bodies in the first layer and a pair of jumper electrode lines in a second layer overlapping with the first layer via an insulating layer, each of the pair of jumper electrode lines connected to two of the electrode bodies that are adjacent to each other through the insulating layer,
wherein each of the pair of jumper electrode lines has a continuous line shape,
each of the first touch electrodes includes a pair of first lines extending in the first direction from one of the pair of jumper electrode lines to an other of the pair of jumper electrode lines in a plan view, and a pair of second lines, each of the pair of second lines crossing the pair of first lines and extending in the second direction and overlapping with a corresponding one of the pair of jumper electrode lines via the insulating layer,
each of the pair of jumper electrode lines includes one continuous portion that overlaps with an entirety of a corresponding one of the pair of second lines and extends between the two electrode bodies it is connected between,
the one continuous portion in each of the pair of jumper electrodes is longer than the second electrode, and
each of the pair of jumper electrode lines includes another portion that is integrally contiguous to the one continuous portion in the first direction, and the another portion is the same length as the pair of first lines.

2. The display device according to claim 1, wherein the first touch electrodes and the second touch electrodes constitute a mesh shape that does not overlap with the plurality of light-emitting pixels.

3. The display device according to claim 1, wherein the first touch electrodes and the second touch electrodes are made from metal.

4. The display device according to claim 1, wherein one of the plurality of light-emitting pixels is provided in an area surrounded by the pair of first lines and the pair of second lines.

5. The display device according to claim 1, wherein a length of the pair of second lines in the second direction is greater than a length of the pair of first lines in the first direction.

6. The display device according to claim 1, wherein a width of one of the pair of second lines is the same as a width of one of the pair of jumper electrode lines.

7. The display device according to claim 1, wherein the pair of jumper electrode lines are connected to one of the electrode bodies via a first contact portion and to another of the electrode bodies via a second contact portion.

8. The display device according to claim 7, wherein the plurality of light-emitting pixels are aligned in the second direction and the first contact portion and the second contact portion are aligned in the second direction.

9. The display device according to claim 8, wherein the plurality of light-emitting pixels are aligned to be parallel to the second direction and provided between the first contact portion and the second contact portion.

10. The display device according to claim 9, wherein at least three light-emitting pixels of the plurality of light-emitting pixels are provided between the first contact portion and the second contact portion.

11. The display device according to claim 9, wherein seven light-emitting pixels of the plurality of light-emitting pixels are provided between the first contact portion and the second contact portion.

12. The display device according to claim 7, wherein each of the electrode bodies has a pair of first slim portions facing each other through a corresponding one of the plurality of light-emitting pixels and extending in the second direction, and a first wide portion connected to the pair of first slim portions,
the pair of jumper electrode lines has a second wide portion connected to the pair of jumper electrode lines, and
the first wide portion and the second wide portion overlap with each other, and the first wide portion is connected to the second wide portion in the first contact portion.

13. The display device according to claim 12, wherein a length of the first wide portion in the second direction is greater than a width of each of the pair of first slim portions in the first direction.

14. The display device according to claim 12, wherein a length of the second wide portion in the second direction is greater than a width of the second wide portion in the first direction.

* * * * *